(12) United States Patent
Castaneda et al.

(10) Patent No.: US 7,209,727 B2
(45) Date of Patent: Apr. 24, 2007

(54) INTEGRATED CIRCUIT RADIO FRONT-END ARCHITECTURE AND APPLICATIONS THEREOF

(75) Inventors: Jesus A. Castaneda, Marina Del Ray, CA (US); Iqbal S. Bhatti, Los Angeles, CA (US); Razieh Roufoogaran, Marina Del Ray, CA (US); Hung Yu Yang, Darien, IL (US)

(73) Assignee: Broadcom Corporation, Irvine, CA (US)

( * ) Notice: Subject to any disclaimer, the term of this patent is extended or adjusted under 35 U.S.C. 154(b) by 210 days.

(21) Appl. No.: 10/459,985

(22) Filed: Jun. 12, 2003

(65) Prior Publication Data

US 2004/0253939 A1 Dec. 16, 2004

(51) Int. Cl.
*H04B 1/16* (2006.01)
(52) U.S. Cl. .................. 455/341; 455/73; 455/78; 455/83
(58) Field of Classification Search ............. 455/41.1, 455/73, 77–78, 80–83, 280, 286, 341, 338, 455/323
See application file for complete search history.

(56) References Cited

U.S. PATENT DOCUMENTS

| | | | | |
|---|---|---|---|---|
| 5,809,408 A | * | 9/1998 | Fujimoto et al. | 455/234.2 |
| 6,356,155 B1 | * | 3/2002 | Judkins | 330/295 |
| 6,711,397 B1 | * | 3/2004 | Petrov et al. | 455/324 |
| 6,823,292 B2 | * | 11/2004 | Spencer | 702/190 |
| 2003/0114129 A1 | * | 6/2003 | Jerng | 455/323 |
| 2004/0207504 A1 | * | 10/2004 | Yang et al. | 336/223 |

\* cited by examiner

*Primary Examiner*—Quochien B. Vuong
*Assistant Examiner*—Tuan H. Nguyen
(74) *Attorney, Agent, or Firm*—Garlick Harrison & Markison (57) ABSTRACT

An integrated RF front-end architecture is disclosed. Such an integrated RF front-end architecture includes a multi-tap balun, a low noise amplifier and a power amplifier core. The multi-tap balun includes a single-ended primary winding and a symmetrical multi-tap secondary winding, wherein the single-ended primary winding is operably coupled to an antenna. The low noise amplifier is coupled to a first set of taps of the symmetrical multi-tap secondary winding. The power amplifier core is coupled to a second set of taps of the symmetrical multi-tap secondary winding and can be a two stage amplifier having a driver stage and an output stage. The multi-tap balun, low noise amplifier and power amplifier core can be on-chip components or can be fabricated to be discrete components on a printed circuit board.

49 Claims, 8 Drawing Sheets

FIG. 3
RF front-end 72

FIG. 4

FIG. 5
LNA 104

FIG. 6
PA core driver stage 130

FIG. 7
PA core output stage 140

FIG. 8
RF front-end 72

INTEGRATED CIRCUIT RADIO FRONT-END ARCHITECTURE AND APPLICATIONS THEREOF

CROSS REFERENCE TO RELATED PATENTS

The present patent is related to co-pending patent applications entitled ON-CHIP TRANSFORMER BALUN, having and a filing date of Jan. 23, 2002, and a Ser. No. 10/055,425; AN INTEGRATED CIRCUIT LOW-NOISE AMPLIFIER AND APPLICATIONS THEREOF, a filing date of Apr. 23, 2002, a Ser. No. 10/128,193.

TECHNICAL FIELD OF THE INVENTION

This invention relates generally to communication systems and, more particularly, to radio receivers and transmitters used within such communication systems.

DESCRIPTION OF RELATED ART

Communication systems are known to support wireless and wire-lined communications between wireless and/or wire-lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, et cetera, communicates directly or indirectly with other wireless communication devices. For direct communications (also known as point-to-point communications), the participating wireless communication devices tune their receivers and transmitters to the same channel or multiple channels (e.g., one or more of the plurality of radio frequency (RF) carriers of the wireless communication system) and communicate over that channel or channels. For indirect wireless communications, each wireless communication device communicates directly with an associated base station (e.g., for cellular services) and/or an associated access point (e.g., for an in-home or in-building wireless network) via an assigned channel, or channels. To complete a communication connection between the wireless communication devices, the associated base stations and/or associated access points communicate with each other directly, via a system controller, via the public switch telephone network, via the internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver receives RF signals, demodulates the RF carrier frequency from the RF signals via one or more intermediate frequency stages to produce, baseband signals, and demodulates the baseband signals in accordance with a particular wireless communication standard to recapture the transmitted data. The transmitter converts data into RF signals by modulating the data in accordance with the particular wireless communication standard to produce baseband signals and mixes the baseband signals with an RF carrier in one or more intermediate frequency stages to produce RF signals.

To recapture data from RF signals, a receiver includes a low noise amplifier, down conversion module and demodulation module. To convert data into RF signals, a transmitter includes a power amplifier, an up-conversion module and a modulation module. For radio frequency integrated circuits (RFICs), it is desirable to provide the low noise amplifier and the power amplifier with differential RF signals, instead of single-ended RF signals, to improve noise performance and common mode rejection. To convert received single-ended RF signals into differential RF signals for a receiver, and to combine differential RF signals into single-ended signals for a transmitter, a receiver and/or transmitter includes a balun (i.e., a balanced/unbalanced transformer).

Until very recently, the baluns were off-chip, i.e., on the printed circuit board, and were typically implemented in the form of micro-strip lines. However, for semiconductor chip designs, it is desirable to place RFIC baluns on-chip to reduce the cost of off-chip printed circuit board components. Recent attempts to integrate a balun onto a radio frequency integrated circuit have had limited success. For example, parallel winding, inter-wound winding, overlay winding, single planar, square wave winding, and concentrical spiral winding on-chip baluns have been tried with limited success. Each of these on-chip baluns suffers from one or more of: low quality factor, (which causes the balun to have a relatively large noise figure and large energy loss); too low of a coupling coefficient (which results in the inductance value of the balun not significantly dominating the parasitic capacitance making impedance matching more complex); asymmetrical geometry (which results in degradation of differential signals); and a relatively high impedance ground connection at the operating frequency.

Other problems exist for RFICs that include on-chip baluns. For example, a power amplifier (PA) and a low noise amplifier (LNA) have different balun requirements. An LNA balun should provide a high voltage gain with a low noise figure (NF), which is directly related to the quality factor (Q) of the balun. An LNA balun should also be inductive enough such that only on-chip capacitors are needed for tuning to match with an antenna impedance and to provide the required voltage gain. A PA balun, however, is required to support large ac and dc currents, which requires a large track width of the transformer windings. The PA balun Q should also be high to provide high efficiency and high PA linearity and should have enough current amplification to provide a large current swing at the antenna output. The PA balun should also be inductive enough such that only on-chip capacitors are needed for impedance matching with an antenna. Typically, separate baluns are used to support an LNA and a PA because of the differing balun requirements of each. However, using two transformer baluns on-chip, along with the associated interconnects, requires too large a die area and complicates the circuitry and design.

Furthermore, in wireless communication systems, the same RF front-end is typically used for both signal transmission and reception. As such, it is necessary to use a transmitter/receiver (T/R) switch to control the system operation mode (transmission or reception). Pin diode switches are commonly used for a T/R switch, resulting in signal losses and additional manufacturing costs.

Therefore, a need exists for an integrated radio frequency (RF) front-end architecture that includes a single symmetrical balun that serves both an LNA and a PA and that provides impedance matching.

SUMMARY OF THE INVENTION

The integrated RF front-end architecture disclosed herein substantially meets these needs and others. Such an integrated Rf front-end architecture includes a multi-tap balun, a low noise amplifier and a power amplifier core. The multi-tap balun includes a single-ended primary winding and a symmetrical multi-tap secondary winding, wherein the single-ended primary winding is operably coupled to an antenna. The low noise amplifier is coupled to a first set of taps of the symmetrical multi-tap secondary winding. The power amplifier core, which may be a two stage amplifier having a driver stage and an output stage, is coupled to a second set of taps of the symmetrical multi-tap secondary winding. The multi-tap balun, low noise amplifier and power amplifier core can be on-chip components or can be fabricated as discrete components on a printed circuit board.

An embodiment of an integrated RF front-end architecture in accordance with this invention can further comprise an input matching circuit operably coupled to the primary winding and to an antenna port, wherein the input matching circuit in combination with an input impedance of the multi-tap balun provides a matched impedance of the RF front-end with respect to the antenna in transmit mode and receive mode. The input matching circuit can comprise a plurality of impedance matching capacitors. The multi-tap balun is also operable to switch between a transmit mode and a receive mode.

The integrated RF front-end architecture may further include the low noise amplifier having an input impedance that is substantially the same in both the low noise amplifier on state and the low noise amplifier off state. Similarly, the output impedance of the power amplifier core may be substantially the same in both the power amplifier core on state and the power amplifier core off state. The integrated RF front-end architecture may further include a ground circuit operably coupled to the multi-tap balun to compensate for bond wire and package inductance and resistance, which if uncompensated, provides a relatively high ground impedance at the operating frequency, or frequencies.

The integrated RF front-end architecture of this invention in any embodiment may be utilized in a radio transceiver of a wireless communication device. The RF front-end, within a receiver section, is operably coupled to receive single-ended RF signals from an antenna and to provide amplified differential RF signals to a down conversion module. The RF front-end, within a transmitter section, is operably coupled to receive outbound differential RF signals from an up-conversion module and provide amplified single-ended signals to an antenna. The single balun of the RF front-end architecture serves as the balun for both the transmit path (power amplifier core) and for the receive path (low noise amplifier) as well as functioning as the transmit/receive switch, thereby reducing manufacturing cost and the on-chip device size as compared to the prior art.

DETAILED DESCRIPTION OF THE INVENTION

Figure 1:
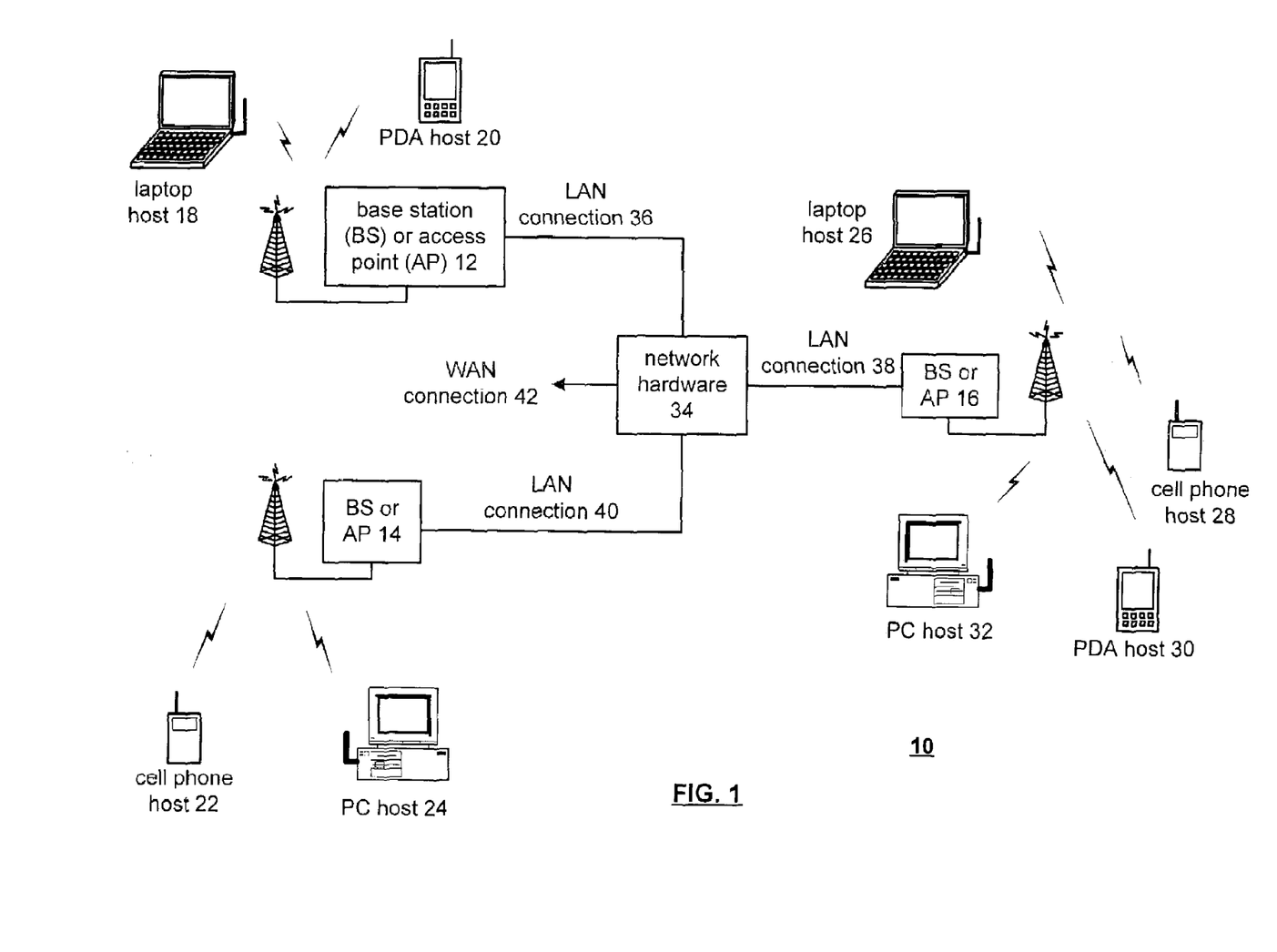
FIG. 1 illustrates a schematic block diagram of a wireless communication system in accordance with the present invention.

FIG. 1 illustrates a schematic block diagram of a communication system 10 that includes a plurality of base stations and/or access points 12–16, a plurality of wireless communication devices 18–32 and a network hardware component 34. The wireless communication devices 18–32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 2.

The base stations or access points 12 are operably coupled to the network hardware 34 via local area network connections 36, 38 and 40. The network hardware 34, which may be a router, switch, bridge, modem, system controller, et cetera, provides a wide area network connection 42 for the communication system 10. Each of the base stations or access points 12–16 has an associated antenna or antenna array to communicate with the wireless communication devices in its area. Typically, the wireless communication devices register with a particular base station or access point 12–14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes an integrated RF front-end architecture as disclosed herein to enhance performance of radio frequency integrated circuits.

Figure 2:
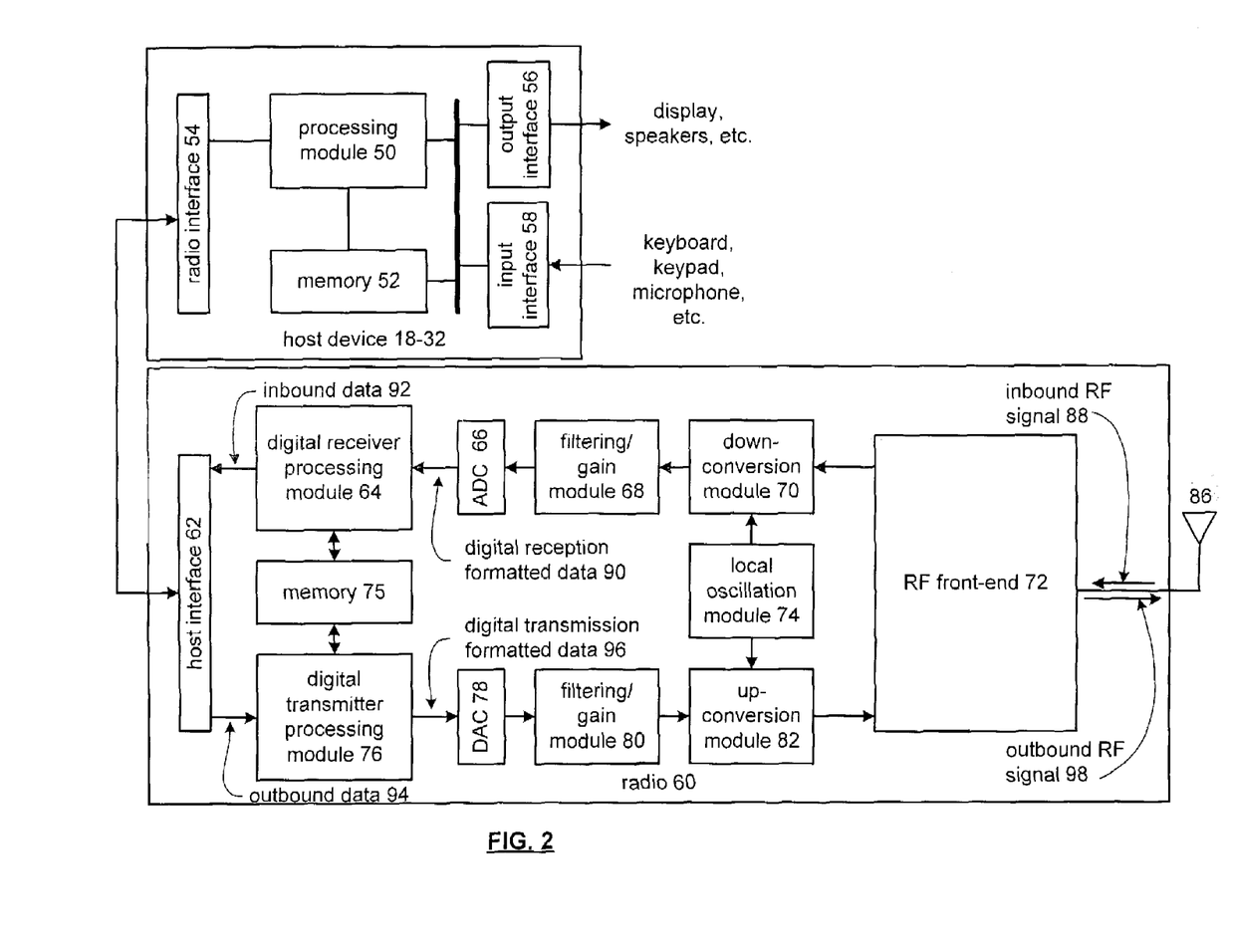
FIG. 2 illustrates a schematic block diagram of a wireless communication device in accordance with the present invention.

FIG. 2 illustrates a schematic block diagram of a wireless communication device that includes the host device 18–32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18–32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to, be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, et cetera, such that the received data may be displayed. The radio interface 54 also provides outbound data from the processing module 50 to the radio 60. The processing module 50 may receive the outbound data from an input device such as a keyboard, keypad, microphone, et cetera, via the input interface 58 or generate the data itself. For data received via the input interface 58, the processing module 50 may perform a corresponding host function on the data and/or route it to the radio 60 via the radio interface 54.

Radio 60 includes a host interface 62, a receiver section, a transmitter section, local oscillation module 74, RF front-end 72, and an antenna 86. The receiver section includes a digital receiver processing module 64, analog-to-digital converter 66, filtering/gain module 68, down conversion module 70, RF front-end 72 (as will be discussed in greater detail with reference to FIGS. 3–8), and at least a portion of memory 75. The transmitter section includes a digital transmitter processing module 76, digital-to-analog converter 78, filtering/gain module 80, up-conversion module 82, RF front-end 72, and at least a portion of memory 75. The antenna 86 may be a single antenna that is shared by the transmit and receive paths via RF front-end 72 or may include separate antennas for the transmit path and the receive path and omit switching between paths. The antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 64 and/or 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 60 receives outbound data 94 from the host device via the host interface 62. The host interface 62 routes the outbound data 94 to the digital transmitter processing module 76, which processes the outbound data 94 in accordance with a particular wireless communication standard (e.g., IEEE 802.11a, IEEE 802.11b, Bluetooth, et cetera) to produce digital transmission formatted data 96. The digital transmission formatted data 96 will be a digital base-band signal or a digital low IF signal, where the low IF will be in the frequency range of zero to a few megahertz.

The digital-to-analog converter 78 converts the digital transmission formatted data 96 from the digital domain to the analog domain. The filtering/gain module 80 filters and/or adjusts the gain of the analog signal prior to providing it to the up-conversion module 82. The up-conversion module 82 directly converts the analog baseband or low IF signal into an RF signal based on a transmitter local oscillation provided by local oscillation module 74. The RF front-end 72 amplifies the RF signal to produce outbound RF signal 98 and routes the outbound RF signal 98 to the antenna 86. The antenna 86 transmits the outbound RF signal 98 to a targeted device such as a base station, an access point and/or another wireless communication device.

The radio 60 also receives, via the antenna 86, an inbound RF signal 88, which can be transmitted by a base station, an access point, or another wireless communication device. The antenna 86 provides the inbound RF signal 88 to the RF front-end 72, which amplifies the signal 88 in accordance with the teachings of the present invention, as will be described in greater detail with reference to FIGS. 3–8, to produce an amplified inbound RF signal. The RF front-end 72 provides the amplified inbound RF signal to the down conversion module 70, which directly converts the amplified inbound RF signal into an inbound low IF signal based on a receiver local oscillation provided by local oscillation module 74. The down conversion module 70 provides the inbound low IF signal to the filtering/gain module 68, which filters and/or adjusts the gain of the signal before providing it to the analog to digital converter 66.

The analog-to-digital converter-66 converts the filtered inbound low IF signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host device 18–32 via the radio interface 54.

As one of average skill in the art will appreciate, the radio may be implemented in a variety of ways to receive RF signals and to transmit RF signals and may be implemented using a single integrated circuit or multiple integrated circuits. Further, at least some of the modules of the radio 60 may be implemented on the same integrated circuit with at least some of the modules of the host device 18–32. Regardless of how the radio is implemented, the concepts of the present invention are applicable.

Figure 3:
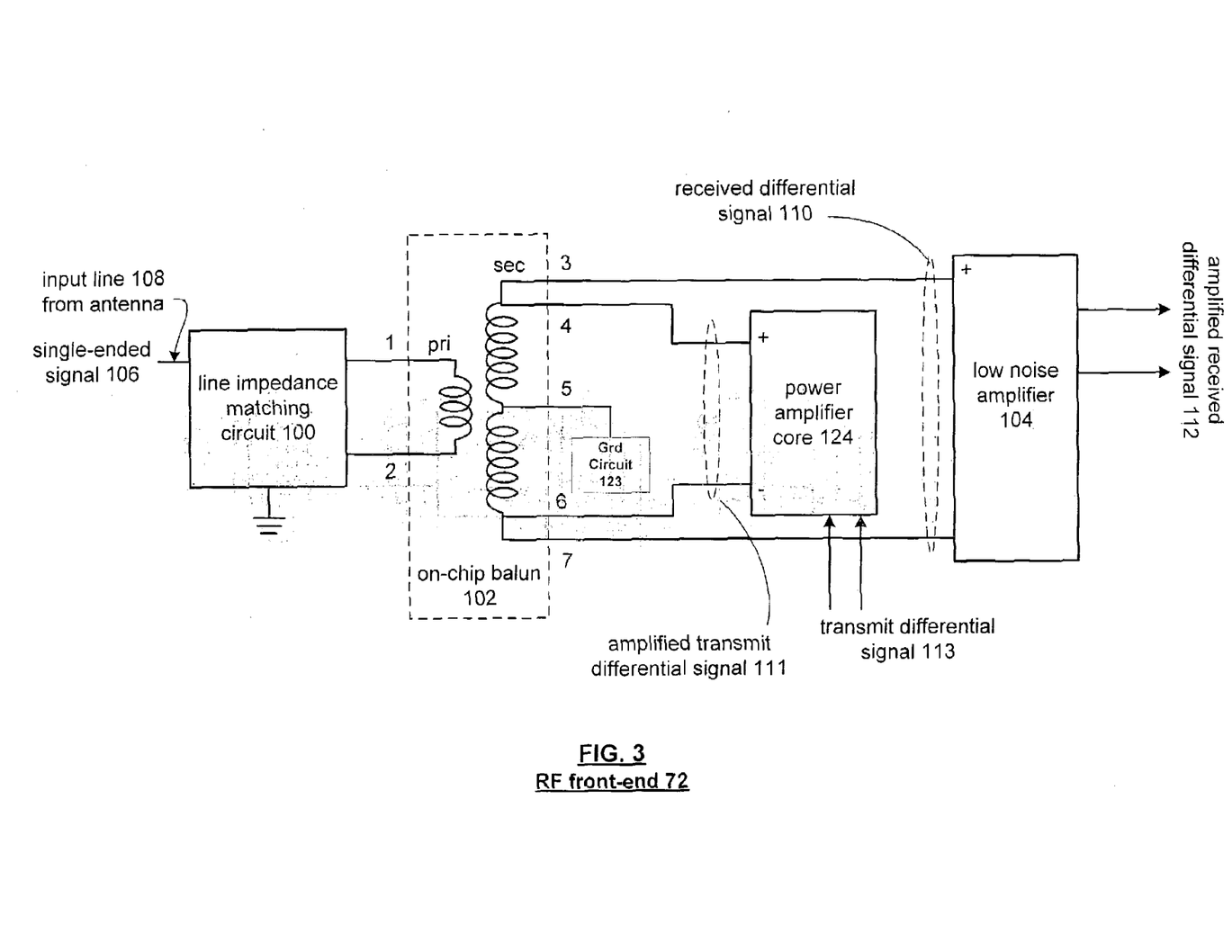
FIG. 3 illustrates a schematic block diagram of an integrated RF front-end in accordance with the present invention.

FIG. 3 illustrates a schematic block diagram of an integrated RF front-end 72 that includes a line impedance matching circuit 100, an on-chip balun 102, an on-chip low noise amplifier 104, and an on-chip power amplifier core 124. The line impedance matching circuit 100, which will be described in greater detail with reference to FIG. 4, receives a single-ended signal 106 (e.g., a singled-ended RF signal 88) via an input line 108 from the antenna 86, or provides a single-ended signal to antenna 86, depending on whether the radio 60 is in transmit or receive mode. The line impedance matching circuit 100 provides an impedance, in conjunction with the primary winding of the balun 102, to substantially match the impedance of the antenna at the operating frequency, or frequencies, of the antenna. Typically, an antenna will have a 50 OHM impedance at the operating frequencies. Correspondingly, the line impedance matching circuit 100 in conjunction with the primary of the on-chip balun 102 will have an impedance of approximately 50 OHMS at the same frequencies.

The on-chip balun 102 may be a symmetrical on-chip balun as described in co-pending U.S. patent application entitled ON-CHIP TRANSFORMER BALUN, having a filing date of Jan. 23, 2002, and a Ser. No. 10/055,425, with the added functionality that it functions as the balun for both the transmitting power amplifier core 124 and the receiving low noise amplifier 104. The primary winding (taps 1 and 2) of the on-chip balun is operably coupled to the line impedance matching circuit 100 to receive or provide the single-ended signal 106. The secondary is center tapped (tap 5) to produce a differential signal 110 from the single-ended signal 106. The center tap connection is coupled to a ground circuit 123. One node of the primary is coupled to the ground of the RF front-end 72, which may be done through a ground circuit that may be included in the line impedance matching circuit 100 or in a separate circuit.

In one embodiment, on-chip balun 102 can be a seven-port transformer balun circuit that is symmetric in structure and provides high current or voltage amplification with a high coupling coefficient-while maintaining minimized overall size. The on-chip balun 102 functions as the balun for both the low noise amplifier 104 and the power amplifier core 124. It further functions as an RF choke (e.g., a dc short and ac high-impedance) for the power amplifier core 124 output-stage. On-chip balun 102 is designed such that the input impedance looking into the single-ended primary winding is substantially the same when either the power amplifier core 124 is on and the low noise amplifier 104 is off, or vice-versa. On-chip balun 102 can therefore function as a transmit/receive switch, eliminating the need for a separate transmit/receive switch.

In the seven-port embodiment shown in FIG. 3, on-chip balun 102 has a two port primary and a five port secondary (in this description, the words "tap" and "port" will be used interchangeably). Port 1 is coupled to the tuning capacitors of impedance matching circuit 100 and port 2 is coupled to a resonant ground circuit 122 (as will be discussed with reference to FIG. 4). Ports 3 and 7 are coupled to the low noise amplifier 104 input ports and ports 4 and 6 are coupled to the power amplifier core 124 output ports (plus and minus ports, respectively). Port 5 is a center-tap ground port and is coupled to ground circuit 123. In an RF integrated circuit design, bridge cross-overs can be incorporated so that ports located in the inner turns can move out of the balun 102.

In the arrangement of FIG. 3, the power amplifier core 124 and the low noise amplifier 104 share the same single-end primary. The LNA and PA core, in effect, see different turn ratios and therefore a different impedance. This arrangement allows on-chip balun 102 to function as a transmit/receive switch since the impedance matching must be valid for both transmission (PA on, LNA off) and receiving (LNA on, PA off) modes. The locations of the low noise amplifier 104 and power amplifier core 124 ports at the on-chip balun 102 are designed so that the requirements of both a power amplifier balun and a low noise amplifier balun are met.

As discussed above, because on-chip balun 102 can function as a transmit/receive switch, the input impedance looking into the single-ended primary must be substantially similar when either the power amplifier core 124 is on and the low noise amplifier 103 is off, or vice-versa. When the power amplifier core 124 or the low noise amplifier 104 is off, it is equivalent to a capacitive load. The low noise amplifier 104 and the power amplifier core 124 port locations are designed such that the single-ended primary input impedance is matched to the antenna 86 through the impedance matching circuit 100.

As one of average skill in the art will appreciate, the port locations for the power amplifier core 124 and the low noise amplifier 104 are different. This is because the inherent nature of low noise amplifier and power amplifier baluns is different. For a low noise amplifier balun, the requirements are a low noise figure (low loss) and a high voltage gain (from the antenna to the low noise amplifier input). A high turn ratio is also desired. For a power amplifier balun, the power amplifier output impedance is more important in order to drive enough current (or power) out of the power amplifier. Usually, a power amplifier balun's turn ratio is smaller than for a low noise amplifier balun. For example, in the embodiment of balun 102 shown in FIG. 3, the low noise amplifier 104 balun turn ratio can be about 7.5 to 2, while the power amplifier core 124 balun uses about 6 and three quarters of the turns.

The impedance matching circuit 100 is used to tune both the power amplifier core 124 and the low noise amplifier 104, and therefore a separate transmit/receive switch is not required. Accordingly, the balun 102 functions as a transmit/receive switch. Further, the secondary for the power amplifier core 124 also functions as a differential inductor that is used as a power amplifier core 124 inductor choke.

As one of average skill in the art will appreciate, while the on-chip balun 102 may have a noise figure that is greater than an off-chip balun, the noise figure of the on-chip balun 102 is reduced to more than acceptable levels by providing gain within the on-chip balun 102. For example, the on-chip balun may have a turns ratio of 2:7.5, where the center tap splits the seven and a half turns of the secondary. To further improve the performance of the on-chip balun 102, the primary may include three shunted primary windings to minimize Ohmic losses.

Figure 4:
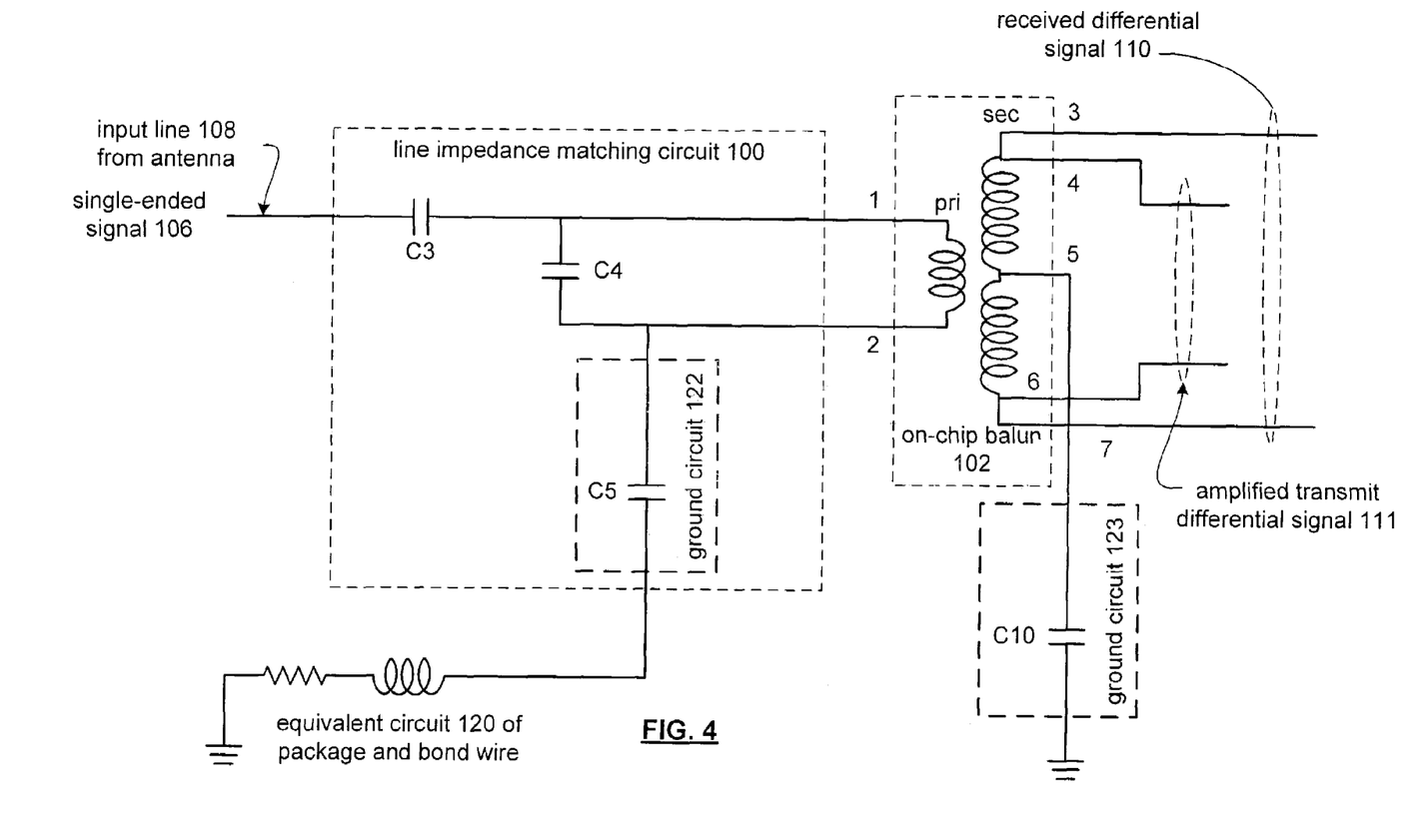
FIG. 4 illustrates a schematic block diagram of a line impedance matching circuit and on-chip balun in accordance with the present invention.

FIG. 4 illustrates a schematic block diagram of the line impedance matching circuit 100 and the on-chip balun 102. As shown, the line impedance matching circuit 100 includes capacitors C3 and C4 and a ground circuit 122. The ground circuit 122 may be implemented utilizing a capacitor C5. Similarly, ground circuit 123 may be implemented using a capacitor C10. The capacitors C3 and C4 are tuned with respect to the inductance value of the on-chip balun 102 to provide the desired input impedance at a particular operating frequency range for the IC low noise amplifier 104 and the power amplifier core 124, and, in addition, to provide gain. The particular operating frequency range may be from 2.4 gigahertz plus or minus 10%, 5.2–5.75 gigahertz plus or minus 10% and/or any other operating range that is used to transceive RF signals.

To simplify the impedance matching to include two capacitors, the on-chip balun 102 is designed such that its impedance at the operating frequencies is primarily determined by its inductances and not its parasitic capacitance. This is achieved by providing a sufficient coupling coefficient as further described in co-pending patent application entitled ON-CHIP TRANSFORMER BALUN, having a filing date of Jan. 23, 2002, and a Ser. No. 10/055,425. If, however, the parasitic capacitance of the on-chip balun 102 is a significant factor at the operating frequencies, the line impedance matching circuit 100 would need to account for the impedance contributions of the parasitic capacitance.

The ground circuit 122, which includes capacitor C5, has a capacitance value such that, when coupled in series with the-equivalent circuit 120 of the package and bond wire (which includes an inductor and resistor), the impedance at the operating frequencies is minimized. In particular, the capacitance value in combination with the inductance value of the bond wire and package provides a bandpass filter at the operating frequencies. As one of average skill in the art will appreciate, the ground circuit 122 may be implemented in a variety of ways to provide a low impedance path for the primary of the on-chip balun to ground.

Figure 5:
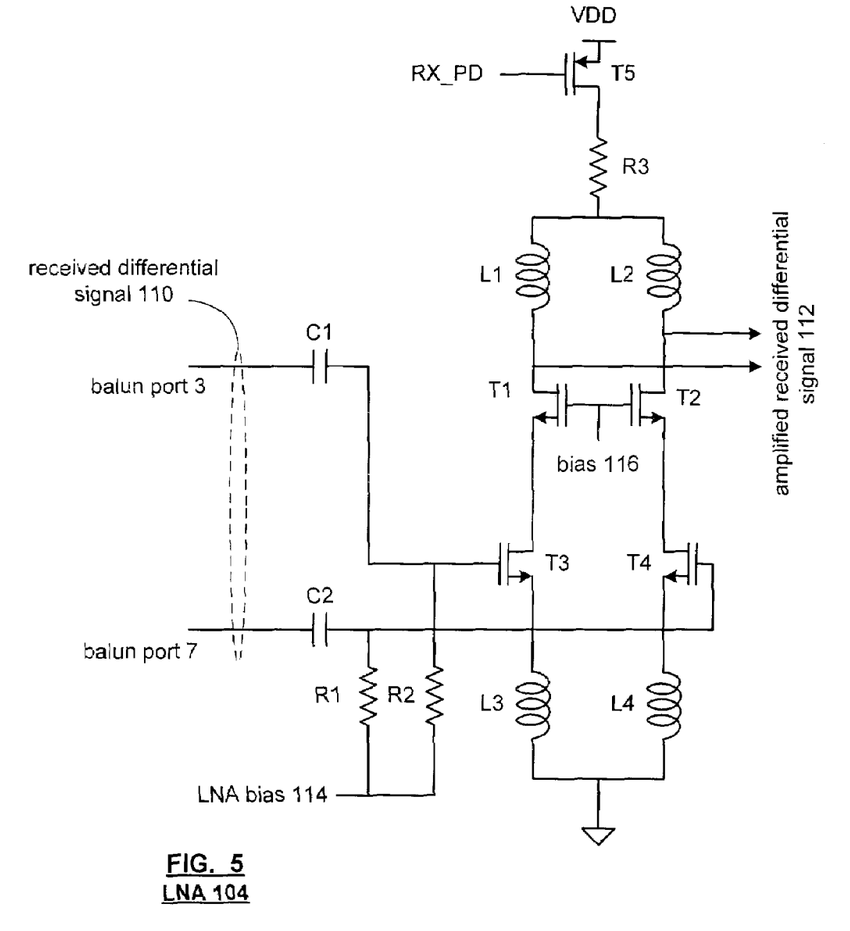
FIG. 5 illustrates a schematic block diagram of an integrated circuit low noise amplifier in accordance with the present invention.

FIG. 5 illustrates a schematic block diagram of an embodiment of low noise amplifier 104. Low noise amplifier 104 is operably coupled to receive the differential signal 110 via AC coupling capacitors C1 and C2, which are sized to block low frequency signals and to pass high frequency signals. The low noise amplifier 104 further includes resistors R1, R2 and R3, inductors L1, L2, L3 and L4, and transistors T1, T2, T3, T4 and T5. Transistors T3 and T4 provide the differential input for the on-chip low noise amplifier 104 and are biased in the linear region via resistors R1 and R2 to a low noise amplifier bias value 114. The design of transistor T3 in conjunction with the inductance of L3 is tuned to provide impedance matching with the output of the on-chip balun 102. Similarly, transistor T4 and inductor L4 are designed to provide impedance matching with the output of balun 102. Further, the inductors L3 and L4 have a relatively low Q, while transistors T3 and T4 have a large transconductance ($g_m$) value to provide a wide frequency range of operation while maintaining a relatively constant impedance. Still further, the parasitic capacitances of transistors T3 and T4 are sized with respect to the inductance values of L3 and L4 to have an insignificant contribution to the impedance of the input of the low noise amplifier 104 at the operating frequencies.

Transistors T1 and T2 are biased via a bias voltage 116. Transistor T5 functions as an on/off switch for low noise amplifier 104, such that low noise amplifier 104 can be switched off when RF front-end 72 is in transmission mode. As configured, the on-chip low noise amplifier 104 produces an amplified received differential signal 112 from the received differential signal 110. Low noise amplifier 104 can be a low noise amplifier such as that disclosed in co-pending patent application entitled AN INTEGRATED CIRCUIT LOW NOISE AMPLIFIER AND APPLICATIONS THEREOF, having a filing date of Apr. 23, 2002, and a Ser. No. 10/128,193, with the added functionality of the on/off switch enabled by transistor T5. The low noise amplifier 104 input impedance is substantially the same in both the low noise amplifier on state and the low noise amplifier off state through the operation of inductors L3 and L4, resistors R1 and R2 and capacitors C1 and C2.

Figure 6:
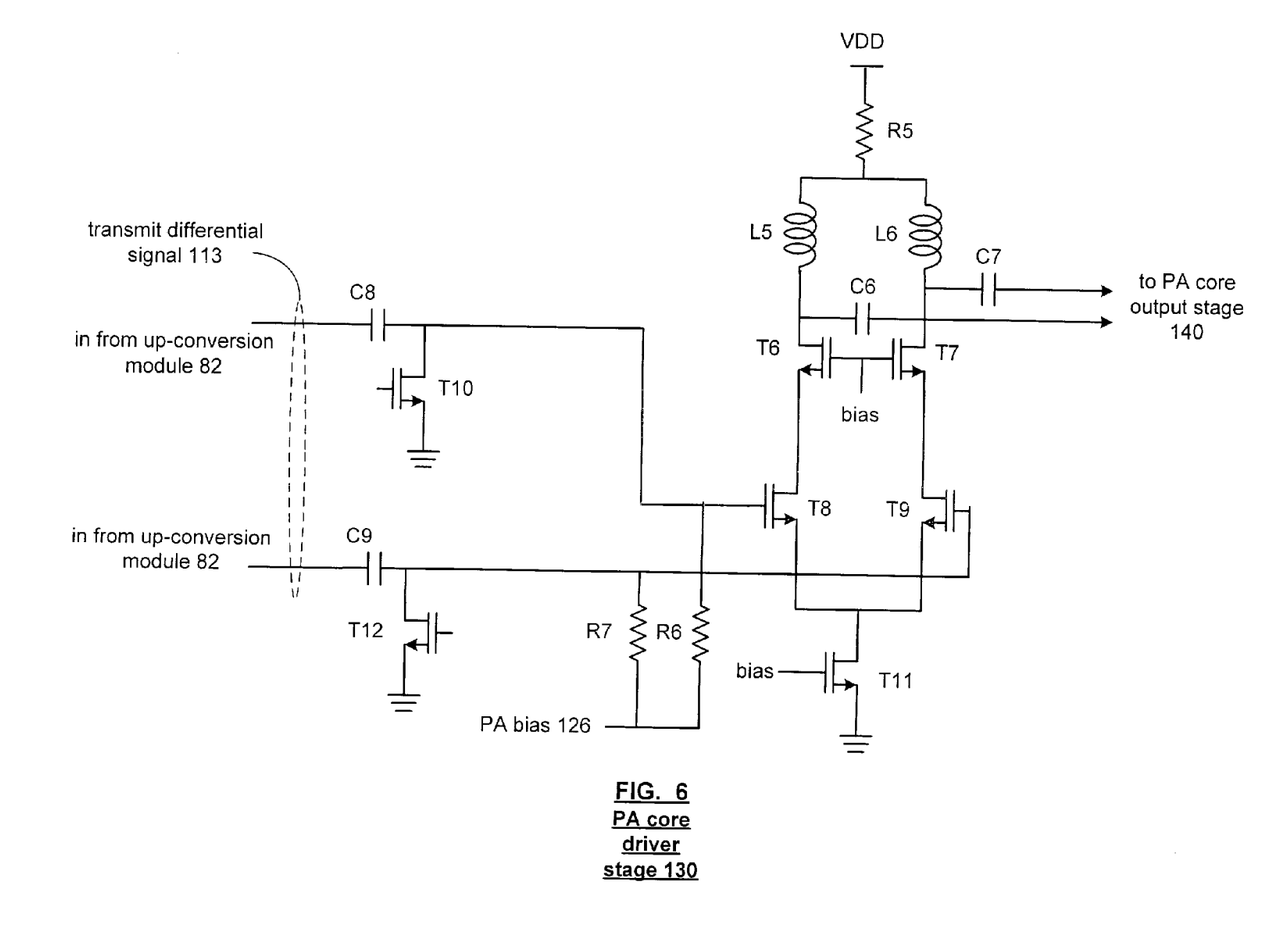
FIG. 6 illustrates a schematic block diagram of the driver stage of a power amplifier core in accordance with the present invention.

FIG. 6 illustrates a schematic block diagram of one embodiment of the driver stage 130 of power amplifier core 124. The power amplifier core 124 driver stage is operably coupled to receive an analog transmit differential signal 113 from up-conversion module 82 of FIG. 2 via AC coupling capacitors C8 and C9, which are sized to block low frequency signals and to pass high frequency signals. The driver stage 130 further includes resistors R5, R6 and R7, inductors L5 and L6, capacitors C6, C7, C8 and C9, and transistors T6, T7, T8, T9, T10, T11 and T12. Transistors T8 and T9 provide the differential input for the power amplifier core 124 driver stage 130 and are biased via resistors R6 and R7 to a PA bias value 126. The design of transistor T6 in conjunction with the inductance of inductor L5 is tuned to provide impedance matching with the input of the power amplifier core 124 output stage 140, to be discussed with reference to FIG. 7. Similarly, transistor T7 and inductor L6 are designed to provide impedance matching with the input of the power amplifier core 124 output stage 140. Transistor T10 and T12 are also operably coupled to receive the analog differential signal from up-conversion module 82 of FIG. 2 via AC coupling capacitors C8 and C9, and function as shunt transistors for transmitter local oscillation leakage. Driver stage 130 provides an amplified differential output to power amplifier core 124 output stage 140 via capacitors C6 and C7. The operation of driver stage 130 should be familiar to one of average skill in the art.

Figure 7:
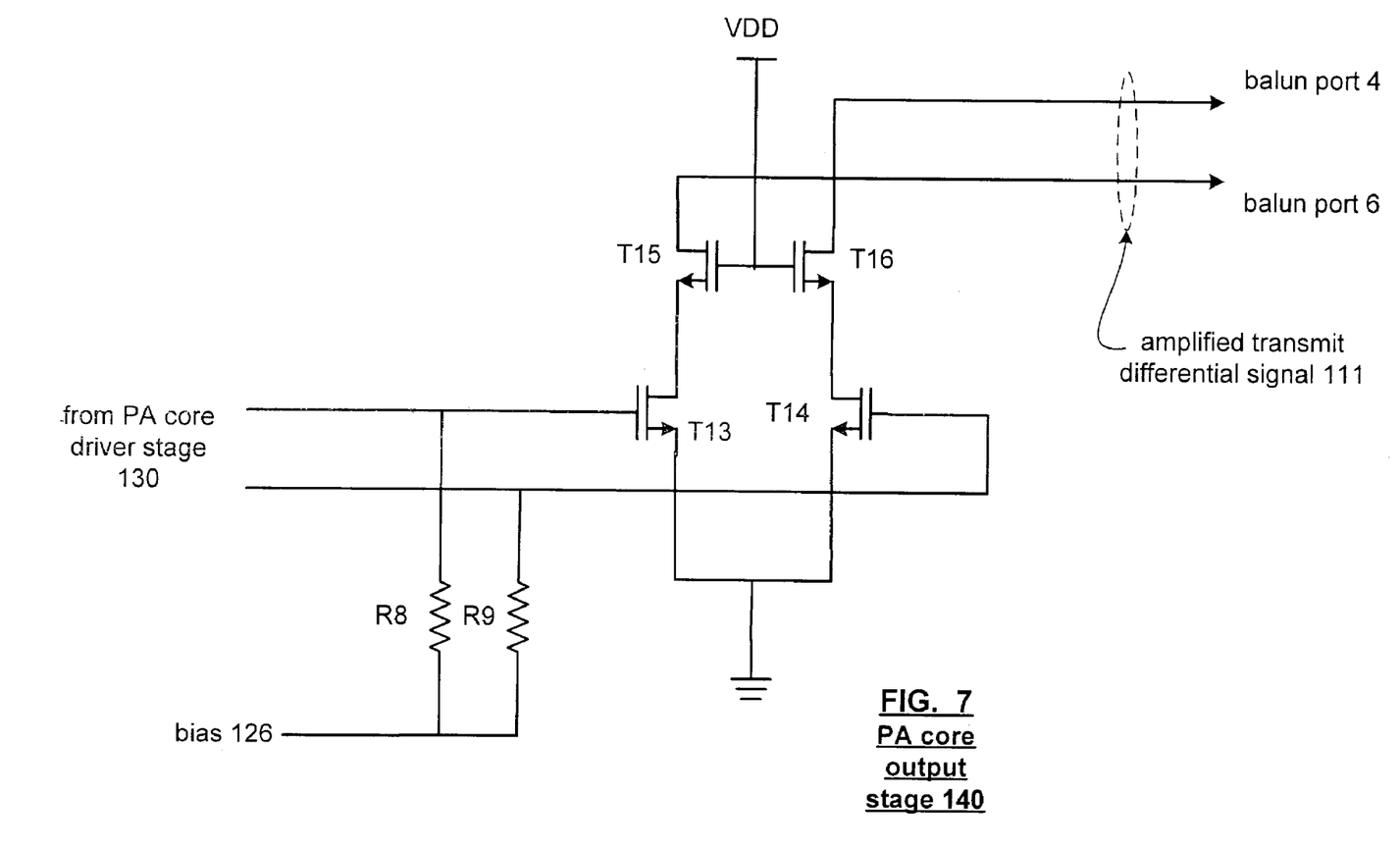
FIG. 7 illustrates a schematic block diagram of the output stage of a power amplifier core in accordance with the present invention.

FIG. 7 illustrates a schematic block diagram of one embodiment of the output stage 140 of power amplifier core 124. Output stage 140 is operably coupled to receive an analog differential signal from driver stage 130 of FIG. 6 at transistors T13 and T14. The output stage 140 further includes resistors R8 and R9, and transistors T15 and T16. Transistors T13 and T14 provide the differential input for the power amplifier core 124 output stage 140 and are biased via resistors R8 and R9 to a bias value 126. Transistors T15 and T16 provide an amplified transmit differential output signal 111 to on-chip balun 102 and provide for output impedance matching for the power amplifier core 124 on and off states. The power amplifier core 124 output impedance is thus kept substantially the same in both the power amplifier core on state and the power amplifier core off state. Output stage 130, and hence power amplifier core 124, thus provide an amplified differential output to on-chip balun 102. The operation of output stage 140 should be familiar to one of average skill in the art.

Figure 8:
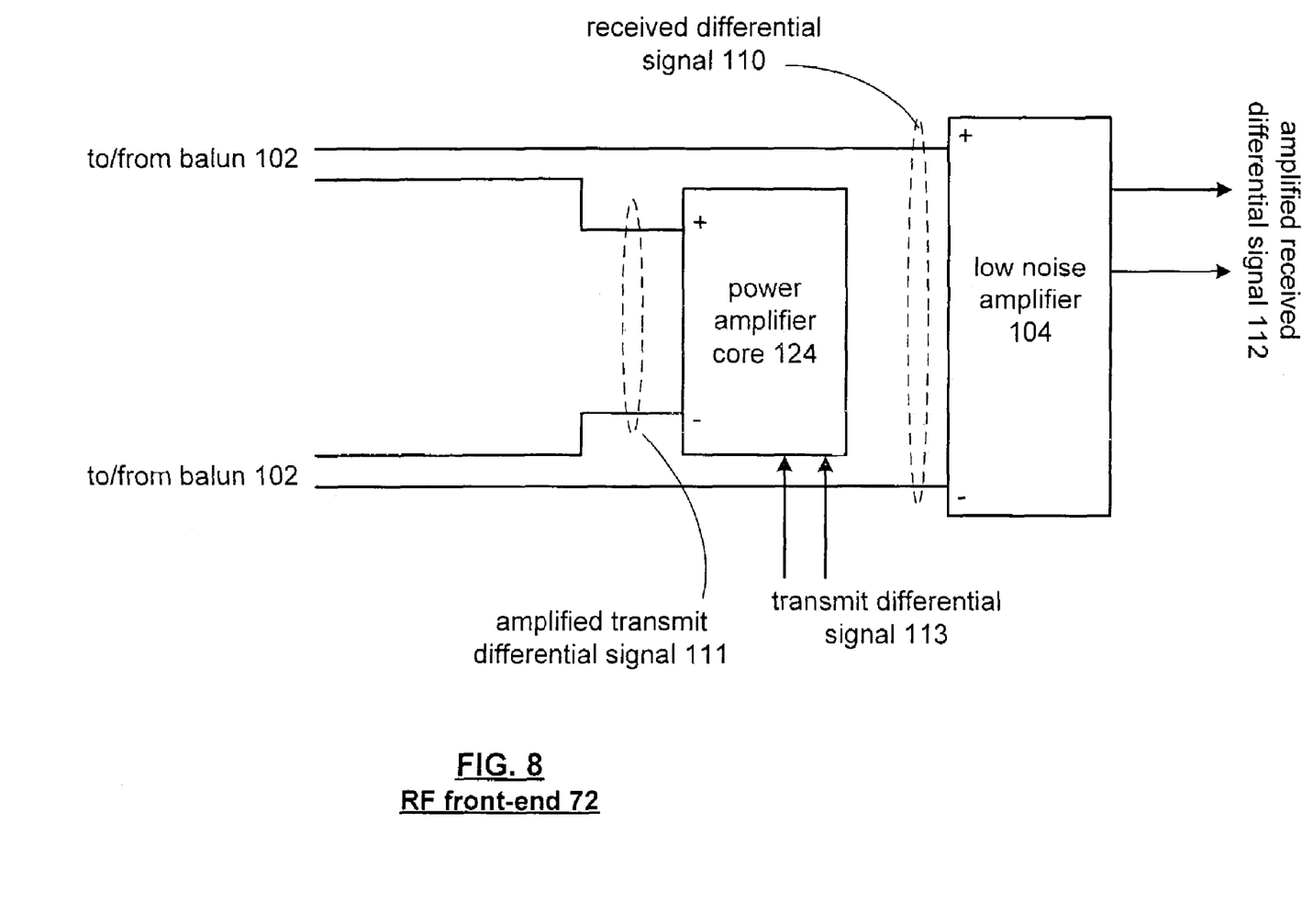
FIG. 8 illustrates an alternate embodiment of an integrated RF front-end in accordance with the present invention.

FIG. 8 illustrates a schematic block diagram of an alternate embodiment of integrated RF front-end 72 according to the teachings of this invention. In this embodiment, the integrated RF front-end 72 includes a power amplifier core 124 and low noise amplifier 104. The low noise amplifier 104 input impedance is substantially the same in both the low noise amplifier on state and the low noise amplifier off state. Similarly, the power amplifier core output impedance is substantially the same in both the power amplifier core on state and the power amplifier core off state. For purposes of this description, substantially the same means within 50% of the same value. The RF front-end 72 can be modified to include an on-chip balun 102 (in accordance with the teachings of this invention), which can itself be modified to include a ground circuit such that the inductance and resistance of packaging and-bond wires are compensated for such that a low impedance ground path is obtained. In addition, the on-chip balun 102 may be modified to include a line impedance matching circuit that includes a pair of capacitors, one coupled in series with the input line 108 from an antenna 86 and another in parallel with the primary winding of the on-chip balun to provide impedance matching.

Other embodiments of the integrated RF front-end architecture of this invention can comprise an off-chip balun operably coupled to an on-chip low noise amplifier and power amplifier core; a balun, low noise amplifier and power amplifier core that are fabricated as discrete components on a printed circuit board; or other such combination and are contemplated to be within the scope of this invention. Further, a fully integrated embodiment of this invention can be configured such that both the primary and secondary balun windings are symmetric with respect to their circuit ports and with respect to each other.

In the various embodiments of the RF front-end of this invention, the balun, impedance matching circuits, low noise amplifier and power amplifier are configured as one circuit and are thus electrically coupled. Therefore, the mutual interaction between the low noise amplifier, the power amplifier core and the balun need to be considered. When transmitting (power amplifier core is on), the low noise amplifier is in an off-state and is treated as a capacitor load coupled to the power amplifier core output through the balun, and vice-versa. An essential aspect is that the input impedance looking from the antenna into the balun will be different depending on whether the system is transmitting or receiving, as controlled by a system algorithm. The design of the RF front-end architecture ensures that the impedance matching is proper for each mode. The power amplifier core, low noise amplifier and balun are designed such that the RF front-end input impedance will be substantially the same from one mode the other.

The preceding discussion has presented an integrated RF front-end architecture and applications within a radio. By incorporating an on-chip balun serving both a low noise amplifier and a power amplifier core, an integrated circuit RF front-end that provides symmetrical differential signaling, impedance matching and switching between transmit and receive modes without a separate transmit/receive switch is obtained. As one of average skill in the art will appreciate, other embodiments may be derived from the teaching of the present invention, without deviating from the scope of the claims.

What is claimed is:

1. A radio frequency (RF) front-end comprises:
    a multi-tap balun having a single-ended primary winding and a symmetrical multi-tap secondary winding, wherein the single-ended primary winding is operably coupled to a transmit and receive antenna and to function as a transmit/receive switch for the transmit and receive antenna;
    a low noise amplifier coupled to a first set of taps of the symmetrical multi-tap secondary winding, the low noise amplifier to be active to receive an inbound signal from the antenna when in a receive mode of operation; and
    a power amplifier core coupled to a second set of taps of the symmetrical multi-tap secondary winding, the power amplifier core to be active to transmit an outbound signal to the antenna when in a transmit mode of operation.

2. The RF front-end of claim 1, further comprising an input matching circuit operably coupled to the primary winding and to an antenna port of the antenna, wherein the input matching circuit in combination with an input impedance of the multi-tap balun provides a matched impedance of the RF front-end with respect to the antenna in the transmit mode and in the receive mode.

3. The RF front-end of claim 2, wherein the input matching circuit comprises a plurality of impedance matching capacitors.

4. The RF front-end of claim 1, wherein the primary winding comprises two taps and wherein the symmetrical multi-tap secondary winding comprises five taps.

5. The RF front-end of claim 1, wherein the low noise amplifier further comprises an input impedance that is substantially the same when the low noise amplifier is active and when the low noise amplifier is off.

6. The RF front-end of claim 1, wherein the power amplifier core further comprises an output impedance that is substantially the same when the power amplifier core is active and when the power amplifier core is off.

7. The RF front-end of claim 1, wherein the low noise amplifier further comprises a transistor operably coupled to function as a low noise amplifier on/off switch.

8. The RF front-end of claim 1, wherein the power amplifier core comprises a driver stage and an output stage.

9. The RF front-end of claim 8, wherein the power amplifier core driver stage includes a shunt transistor to shunt local oscillation leakage from reaching the output stage.

10. The RF front-end of claim 1, wherein the symmetrical multi-tap secondary winding is operable as a differential inductor to provide an RF choke for the power amplifier core.

11. The RF front-end of claim 1, wherein the RF front-end is fabricated on an integrated circuit ("IC").

12. The RF front-end of claim 11, wherein the low noise amplifier is symmetrically coupled to the multi-tap balun and wherein the power amplifier core is symmetrically coupled to the multi-tap balun.

13. The RF front-end of claim 1, wherein the multi-tap balun, the low noise amplifier and the power amplifier core are discrete components on a printed circuit board.

14. The RF front-end of claim 1, wherein the low noise amplifier and the power amplifier core are fabricated on an integrated circuit and wherein the multi-tap balun is a discrete component on an off-chip component.

15. A radio frequency (RF) front-end comprises:
    a multi-tap balun having a single-ended primary winding and a symmetrical multi-tap secondary winding, wherein the single-ended primary winding is operably coupled to a transmit and receive antenna and to function as a transmit/receive switch for the transmit and receive antenna;
    a low noise amplifier having an input impedance substantially the same in both the low noise amplifier on state and the low noise amplifier off state, the low noise amplifier to be in the on state to receive an inbound signal from the antenna when in a receive mode of operation; and
    a power amplifier core having an output impedance substantially the same in both the power amplifier core on state and the power amplifier off state, the power amplifier core to be in the on state to transmit an outbound signal to the antenna when in a transmit mode of operation.

16. The RF front-end of claim 15, wherein the low noise amplifier is coupled to a first set of taps of the symmetrical multi-tap secondary winding and wherein the power amplifier core is coupled to a second set of taps of the symmetrical multi-tap secondary winding.

17. The RF front-end of claim 15, further comprising an input matching circuit operably coupled to the primary winding and to an antenna port of the antenna, wherein the input matching circuit in combination with an input impedance of the multi-tap balun provides a matched impedance of the RF front-end with respect to an antenna in the transmit mode and in the receive mode.

18. The RF front-end of claim 17, wherein the input matching circuit comprises a plurality of impedance matching capacitors.

19. The RF front-end of claim 15, wherein the symmetrical multi-tap secondary winding is operable as a differential inductor to provide an RF choke for the power amplifier core.

20. The RF front-end of claim 15, wherein the low noise amplifier further comprises a transistor operably coupled to function as a low noise amplifier on/off switch.

21. The RF front-end of claim 15, wherein the power amplifier core comprises a driver stage and an output stage.

22. The RF front-end of claim 21, wherein the power amplifier core driver stage includes a shunt transistor to shunt local oscillation leakage from reaching the output stage.

23. The RF front-end of claim 15, wherein the RF front-end is fabricated on an integrated circuit ("IC").

24. A radio comprising:
a transmitter section operably coupled to convert outbound data into outbound differential radio frequency (RE) signals based on a transmitter local oscillation;
a receiver section operably coupled to convert inbound differential RF signals into inbound data based on a receiver local oscillation; and
an RF front-end, operably coupled to convert the outbound differential RF signals into outbound single-ended RF signals and to convert inbound single-ended RF signals into the inbound differential RF signals, wherein the RF front-end comprises:
a multi-tap balun having a single-ended primary winding and a symmetrical multi-tap secondary winding, wherein the single-ended primary winding is operably coupled to a transmit and receive antenna and the symmetrical multi-tap secondary winding is to provide differential taps for the balun, in which the multi-tap balun is to function as a transmit/receive switch for the transmit and receive antenna;
a low noise amplifier coupled to a first set of taps of the symmetrical multi-tap secondary winding, the low noise amplifier to be active when in a receive mode of operation to receive the inbound differential RF signals from the first set of taps; and
a power amplifier core coupled to a second set of taps of the symmetrical multi-tap secondary winding, the power amplifier core to be active when in a transmit mode of operation to transmit the outbound differential RF signals to the second set of taps.

25. The radio of claim 24, wherein the RF front end further comprises an input matching circuit operably coupled to the primary winding and to an antenna port of the antenna, wherein the input matching circuit in combination with an input impedance of the multi-tap balun provides a matched impedance of the RF front-end with respect to the antenna in the transmit mode and in the receive mode.

26. The radio of claim 25, wherein the input matching circuit comprises a plurality of impedance matching capacitors.

27. The radio of claim 24, wherein the primary winding comprises two taps and wherein the symmetrical multi-tap secondary winding comprises five taps.

28. The radio of claim 24, wherein the low noise amplifier further comprises an input impedance that is substantially the same when the low noise amplifier is active and when the low noise amplifier is off.

29. The radio of claim 24, wherein the power amplifier core further comprises an output impedance that is substantially the same when the power amplifier core is active and when the power amplifier core is off.

30. The radio of claim 24, wherein the low noise amplifier further comprises a transistor operably coupled to function as a low noise amplifier on/off switch.

31. The radio of claim 24, wherein the power amplifier core comprises a driver stage and an output stage.

32. The radio of claim 31, wherein the power amplifier core driver stage includes a shunt transistor to shunt local oscillation leakage from reaching the output stage.

33. The radio of claim 24, wherein the symmetrical multi-tap secondary winding is operable as a differential inductor to provide an RF choke for the power amplifier core.

34. The radio of claim 24, wherein the RF front-end is fabricated on an integrated circuit ("IC").

35. The radio of claim 24, wherein the multi-tap balun, the low noise amplifier and the power amplifier core are discrete components on a printed circuit board.

36. The radio of claim 24, wherein the low noise amplifier and the power amplifier core are fabricated on an integrated circuit and wherein the multi-tap balun is a discrete component on an off-chip component.

37. A radio comprising:
a transmitter section operably coupled to convert outbound data into outbound differential radio frequency (RF) signals based on a transmitter local oscillation;
a receiver section operably coupled to convert inbound differential RF signals into inbound data based on a receiver local oscillation; and
an RF front-end, operably coupled to convert the outbound differential RF signals into outbound single-ended RF signals and to convert inbound single-ended RF signals into the inbound differential RF signals, wherein the RF front-end comprises:
a multi-tap balun having a single-ended primary winding and a symmetrical multi-tap secondary winding, wherein the single-ended primary winding is operably coupled to a transmit and receive antenna and the symmetrical multi-tap secondary winding is to provide differential taps for the balun, in which the multi-tap balun is to function as a transmit/receive switch for the transmit and receive antenna;
a low noise amplifier having an input impedance substantially the same in both the low noise amplifier on state and the low noise amplifier off state, the low noise amplifier to be in the on state to receive the inbound differential RF signals from a first set of taps of the symmetrical multi-tap secondary winding when in a receive mode of operation; and
a power amplifier core having an output impedance substantially the same in both the power amplifier core on state and the power amplifier off state, the power amplifier core to be in the on state to transmit the outbound differential RF signals to a second set of taps of the symmetrical multi-tap secondary winding when in a transmit mode of operation.

38. The radio of claim 37, wherein the RF front end further comprises an input matching circuit operably coupled to the primary winding and to an antenna port of the antenna, wherein the input matching circuit in combination with an input impedance of the multi-tap balun provides a matched impedance of the RF front-end with respect to an antenna in transmit mode and receive mode.

39. The radio of claim 38, wherein the input matching circuit comprises a plurality of impedance matching capacitors.

40. The radio of claim 37, wherein the primary winding comprises two taps and wherein the symmetrical multi-tap secondary winding comprises five taps.

41. The radio of claim 37, wherein the symmetrical multi-tap secondary winding is operable as a differential inductor to provide an RF choke for the power amplifier core.

42. The radio of claim 37, wherein the RF front-end is fabricated on an integrated circuit ("IC").

43. The radio of claim 37, wherein the low noise amplifier is symmetrically coupled to the multi-tap balun and wherein the power amplifier core is symmetrically coupled to the multi-tap balun.

44. The radio of claim 37, wherein the multi-tap balun, the low noise amplifier and the power amplifier core are discrete components on a printed circuit board.

45. The radio of claim 37, wherein the low noise amplifier and the power amplifier core are fabricated on an integrated circuit and wherein the multi-tap balun is a discrete component of an off-chip component.

46. The radio of claim 37, wherein the low noise amplifier further comprises a transistor operably coupled to function as a low noise amplifier on/off switch.

47. The radio of claim 37, wherein the power amplifier core comprises a driver stage and an output stage.

48. The radio of claim 47, wherein the power amplifier core driver stage includes a shunt transistor to shunt local oscillation leakage from reaching the output stage.

49. The radio of claim 37, wherein the RF front-end is fabricated on an integrated circuit ("IC").

* * * * *

UNITED STATES PATENT AND TRADEMARK OFFICE
CERTIFICATE OF CORRECTION

| | |
|---|---|
| PATENT NO. | : 7,209,727 B2 |
| APPLICATION NO. | : 10/459985 |
| DATED | : April 24, 2007 |
| INVENTOR(S) | : Jesus Castaneda et al. |

It is certified that error appears in the above-identified patent and that said Letters Patent is hereby corrected as shown below:

Column 13, line 19, in Claim 24: replace "(RE)" with --(RF)--.

Signed and Sealed this

Sixteenth Day of December, 2008

JON W. DUDAS
*Director of the United States Patent and Trademark Office*